United States Patent [19]

Anderson

[11] Patent Number: 5,072,197
[45] Date of Patent: Dec. 10, 1991

[54] RING OSCILLATOR CIRCUIT HAVING IMPROVED FREQUENCY STABILITY WITH RESPECT TO TEMPERATURE, SUPPLY VOLTAGE, AND SEMICONDUCTOR PROCESS VARIATIONS

[75] Inventor: Daryl E. Anderson, Corvallis, Oreg.

[73] Assignee: Hewlett-Packard Company, Palo Alto, Calif.

[21] Appl. No.: 637,040

[22] Filed: Jan. 3, 1991

[51] Int. Cl.$^5$ .......................... H03B 5/12; H03L 1/00
[52] U.S. Cl. ..................................... 331/57; 331/175; 331/176
[58] Field of Search .......................... 331/57, 175, 176

[56] References Cited

U.S. PATENT DOCUMENTS

| | | | |
|---|---|---|---|
| 3,978,431 | 8/1976 | Lattin | 331/108 C |
| 4,094,137 | 6/1978 | Morokawa | 58/23 A |
| 4,205,518 | 6/1980 | Morokawa | 368/67 |
| 4,259,715 | 3/1981 | Morokawa | 363/60 |
| 4,337,529 | 6/1982 | Morokawa | 368/10 |
| 4,358,728 | 11/1982 | Hashimoto | 323/275 |
| 4,443,116 | 4/1984 | Yoshida et al. | 368/202 |
| 4,519,086 | 5/1985 | Hull et al. | 375/120 |
| 4,547,749 | 10/1985 | Kuo | 331/57 |
| 4,559,616 | 12/1985 | Bruder | 365/28 |
| 4,710,648 | 12/1987 | Hanamura et al. | 307/443 |
| 4,714,901 | 12/1987 | Jain et al. | 331/176 |
| 4,789,976 | 12/1988 | Fujishima | 369/54 |

*Primary Examiner*—Siegfried H. Grimm

[57] ABSTRACT

A compensation circuit (14) for a ring oscillator (12) having an odd plurality of series-connected CMOS inverter stages includes first and second P-channel transistors and a resistor. The first transistor (32) has a source coupled to VDD and a gate coupled to ground. The resistor (34) is coupled between the drain of the first transistor and ground. The second transistor (36) has a source coupled to VDD, a gate coupled to the drain of the first transistor, and a drain coupled to a supply node of each of the inverter stages of the ring oscillator for providing a supply voltage that is compensated with respect to voltage, temperature, and semiconductor processing variables. In operation, the conductivity of the first transistor inversely controls the conductivity of the second transistor that supplies a compensated power to the inverter stages. The compensated power controls the conductivity of the transistors in the ring oscillator and the corresponding frequency of oscillation.

10 Claims, 1 Drawing Sheet

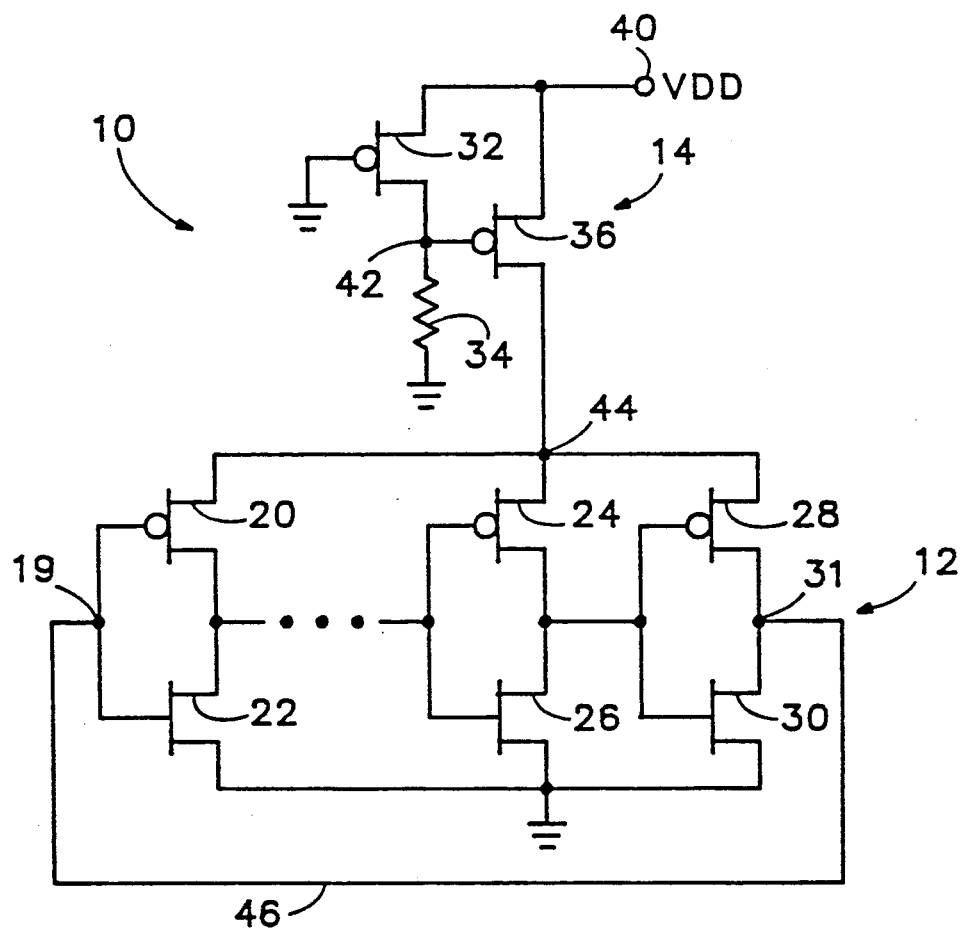

RING OSCILLATOR CIRCUIT HAVING IMPROVED FREQUENCY STABILITY WITH RESPECT TO TEMPERATURE, SUPPLY VOLTAGE, AND SEMICONDUCTOR PROCESS VARIATIONS

BACKGROUND OF THE INVENTION

This invention relates to ring oscillators, and more particularly, to ring oscillators that are compensated for the effects of voltage, temperature, and/or semiconductor processing variables.

Ring oscillators are well known in the art. An odd number of series-connected inverter stages has the output of the last inverter stage coupled to the input of the first inverter stage to create an oscillation. The number of inverter stages determines the frequency of oscillation. Typically, each inverter stage has a first supply node connected to a first supply voltage such as five volts, and a second supply node connected to a second supply voltage such as ground. The generated oscillating signal can be used as a clock signal or the like. However, the operating frequency of the oscillating signal is unstable. Frequency can vary greatly as a function of voltage, temperature, and, if the ring oscillator is fabricated as an integrated circuit, semiconductor processing variables. Because of the frequency instability, ring oscillators are of relatively limited use in applications where a stable frequency is desired.

In the past, techniques for compensating integrated circuit ring oscillators have involved complex circuitry such as in U.S. Pat. No. 4,714,901 to Jain et al or separate circuits such as in U.S. Pat. No. 4,547,749 to Kuo. Such circuits, while providing a compensated ring oscillator having a stable frequency of oscillation, undesirably increase the area of the integrated circuit.

What is desired is a simple circuit including as few components as possible for stabilizing the frequency of oscillation of a ring oscillator with respect to voltage, temperature, and semiconductor processing variables.

SUMMARY OF THE INVENTION

It is therefore an object of the present invention to stabilize the frequency of oscillation of a ring oscillator with respect to voltage and temperature, and, when fabricated in integrated circuit form, with respect to semiconductor processing variables.

Another object of the invention is to provide a compensation circuit for a ring oscillator that includes as few components as possible.

Other objects, features, and advantages or the present invention are obvious to those skilled in the upon a reading of the following specification and claims in light of the accompanying drawing FIGURE.

According to the present invention, a compensation circuit for a ring oscillator having an odd plurality of series-connected CMOS inverter stages, each inverter stage having a supply node for receiving a supply voltage, includes first and second P-channel transistors and a resistor. The first transistor has a source coupled to a supply voltage VDD and a gate coupled to ground. The resistor is coupled between the drain of the first transistor and ground. The second transistor has a source coupled to VDD, a gate coupled to the drain of the first transistor, and a drain coupled to the supply node of each of the inverter stages of the ring oscillator. The compensation circuit thus provides a supply voltage to the inverter stages that is compensated with respect to voltage, temperature, and semiconductor processing variables. In operation, the conductivity of the first transistor monitors the conductivity of transistors in the ring oscillator and inversely controls the conductivity of the second transistor. The second transistor supplies a compensated power to the inverter stages, thereby controlling the conductivity of the ring oscillator transistors and the frequency of oscillation.

BRIEF DESCRIPTION OF THE DRAWING

The sole FIGURE is a circuit diagram of a ring oscillator circuit including a compensation circuit according to a preferred embodiment of the present invention.

DETAILED DESCRIPTION OF THE INVENTION

Shown in the sole FIGURE is a compensated ring oscillator 10 generally comprising a ring oscillator circuit 12 and a compensation circuit 14. Ideally, the compensated ring oscillator 10 is fabricated on an integrated circuit using a complementary metal-oxide semiconductor ("CMOS") process.

The ring oscillator 12 comprises an odd number of series-connected CMOS inverter stages 20-22, 24-26, and 28-30. Each inverter stage comprises a P-channel transistor 20, 24, 28, and an N-channel transistor 22, 26, 30. In each stage the P-channel and N-channel transistors have coupled gates to form an input and coupled drains to form an output. The output 31 of the last inverter 28-30 is coupled to the input 19 of the first inverter 20-22 through conductor 46 to start the oscillation. Each inverter stage has a first supply node at the source of the corresponding P-channel transistor and a second supply node at the source of the corresponding N-channel transistor for receiving a supply voltage.

The compensation circuit 14 generally comprises an intermediate supply node 44 coupled to the first supply node of each of the inverters, a first P-channel transistor 32, a resistor 34, and a second P-channel transistor 36. The first transistor 32 has a source coupled to a first source of supply voltage, VDD, at terminal 40. The supply voltage VDD is typically set to five volts. The gate of P-channel transistor 32 is coupled to a second source of supply voltage, viz. ground, such that the transistor is biased on. Resistor 34 is coupled between the drain 42 of P-channel transistor 32 and ground. P-channel transistor 36 has a source coupled to VDD, a gate coupled the drain 42 of P-channel transistor 32, and a drain coupled to the intermediate supply node 44. This arrangement provides a compensated supply voltage at node 44 to each of the inverters in the ring oscillator 12.

In operation, the conductivity of the first P-channel transistor 32 inversely controls the conductivity of the second P-channel transistor 36 that supplies power to the inverter stages. Since the frequency of the ring oscillator 12 increases with increasing conductivity of the devices in the inverter stages, the control mechanism returns the frequency of the ring oscillator to a nominal level by decreasing the conductivity of P-channel transistor 36. The conductivity of a CMOS transistor increases due to changes in temperature or semiconductor processing variables. Since the ring oscillator 12 and compensation circuit 14 are ideally fabricated in an integrated circuit on the same substrate, P-channel transistor 32 monitors the changes in conductivity of similar transistors 20, 24, and 28. As the conductivity of P-channel transistor 32 increases, more current flows through resistor 34, and the voltage at circuit node 42 increases. In turn, the gate-to-source voltage of P-channel transistor 36 decreases, diminishing the conductivity and current supplied to the ring oscillator 12. Thus, the increase in conductivity of the transistors in the ring oscillator 12 and resultant increase in oscillator frequency is controlled by supplying less current to the ring oscillator 12 that returns the oscillator frequency to a nominal value.

Similarly, increases in the power supply, VDD, are compensated by the compensation circuit 14. An increase in VDD increases the gate-to-source voltage and conductivity of P-channel transistor 32, which increases the current in resistor 34 and the voltage at circuit node 42. Consequently, the gate-to-source voltage of P-channel transistor 36 decreases, which tends to keep the current flow provided by P-channel transistor 36 constant. Thus, the transistors in the ring oscillator 12 are operated at nominal operating power and the frequency of oscillation remains relatively constant, notwithstanding variations in VDD.

Resistor 34 can be constructed using an N-type island that is readily available in a CMOS semiconductor process. Computer simulations confirm that such an implementation provides about an order of magnitude improvement in frequency stability with respect to temperature variation, and about a factor of two with respect to voltage supply variation. If desired, a resistor that has a value that varies less than 5% with temperature, voltage, and semiconductor process variations can be substituted for the on-chip N-type island resistor. Computer simulations confirm that such a precision resistor can be an external (off-chip) resistor or a trimmed internal thin film resistor. In this case, frequency stability can be improved about an order of magnitude with respect to semiconductor process variations.

The sizes of transistors 32 and 36, and the value of resistor 34 are chosen to achieve maximum frequency stability with a specific semiconductor integrated circuit process. The following values are provided below for a typical CMOS process and frequency of oscillation, but different values may be required for other processes or operating conditions.

EXAMPLE

P-channel threshold voltage = 1 volt
N-channel threshold voltage = 1 volt
VDD = 5 volts

Ring Oscillator 12

P-channel transistor size: width = 16 microns, length = 1.2 microns
N-channel transistor size: width = 16 microns, length = 1.2 microns
Number of inverter stages = 9
Frequency of oscillation = 100 Mhz

Compensation Circuit 14

Transistor 32 size: width = 50 microns length = 2 microns
Transistor 36 size: width = 200 microns length = 2 microns
Resistor 34 value = 1300 ohms The size of transistor 36 is directly proportional to the number of inverter stages and is chosen to provide sufficient power to all of the inverter stages in the ring oscillator 12. Resistor 34 is chosen to have a value sufficient to modulate the gate-to-source voltage of transistor 36. If the resistor value is too low, no modulation occurs; if the resistor value is too high, too much voltage is dropped across resistor 34, decreasing gate-to-source voltage, thus turning off transistor 36. To arrive at a suitable final value for the resistor value and the transistor sizes, it may be desirable to choose an initial value and iteratively change values to maximize frequency stability.

While the invention has been described in a preferred embodiment, it is apparent to those skilled in the art that the disclosed invention can be modified in numerous ways and assume other embodiments than specifically set forth and described above. For example, it is apparent that N-channel transistors can be used in compensation circuit 14, wherein the compensation circuit is coupled between the sources of N-channel transistors 22, 26, and 30 and ground, and the sources of P-channel transistors 20, 24, and 28 are coupled to VDD. Accordingly, it is intended that all modifications of the invention that fall within the true spirit and scope of the present invention are covered by the appended claims.

I claim:

1. A compensation circuit for stabilizing the frequency of a ring oscillator of the type having an odd plurality of series-connected inverter stages wherein an output of a last inverter stage is coupled to an input of a first inverter stage, each inverter stage having a supply node for receiving a supply voltage, the compensation circuit comprising:
   an intermediate supply node coupled to the supply nodes of each of the inverters;
   a first transistor having a first current electrode coupled to a first source of supply voltage (VDD), a second current electrode, and a control electrode coupled to a second source of supply voltage (ground);
   a resistor coupled between the second current electrode of the first transistor and the second source of supply voltage; and
   a second transistor having a first current electrode coupled to the first source of supply voltage, a control electrode coupled to the second current electrode of the first transistor, and a second current electrode coupled to the intermediate supply node for providing a compensated supply voltage.

2. A compensation circuit as in claim 1 in which the resistor comprises an N-type island.

3. A compensation circuit as in claim 1 in which the resistor comprises a trimmed thin film resistor.

4. A compensation circuit as in claim 1 in which the ring oscillator and the first and second transistors are fabricated on an integrated circuit, and the resistor comprises an external precision resistor.

5. A compensation circuit as in claim 1 in which the size of the second transistor is proportional to the number of inverter stages.

6. A frequency stabilized CMOS ring oscillator comprising:
   a ring oscillator having an odd plurality of CMOS inverter stages, each inverter stage having a P-channel transistor and an N-channel transistor, a first supply node coupled to an intermediate node, and a second supply node coupled to ground; and
   a compensation circuit coupled between a source of constant supply voltage (VDD) and the intermediate node, the compensation circuit including:

a P-channel transistor having a gate, a source coupled to a source of constant supply voltage, and a drain coupled to the intermediate node; and means coupled to the gate of the P-channel transistor for inversely controlling the conductivity of the P-channel transistor with respect to the conductivity of the P-channel transistor in each of the inverter stages.

7. A frequency stabilized CMOS ring oscillator as in claim 6 in which the means for inversely controlling the conductivity of the P-channel transistor comprises:

a second P-channel transistor having a source coupled to the source of constant supply voltage, a gate coupled to ground, and a drain; and a resistor coupled between the drain of the second P-channel transistor and ground.

8. In a CMOS ring oscillator having an odd plurality of complementary P-channel, N-channel transistor inverter stages coupled to an intermediate circuit node and an output for providing an oscillating signal operating at a nominal frequency, a method for compensating the frequency of oscillation, the method comprising:

coupling a first P-channel transistor between a source of constant supply voltage (VDD) and the intermediate circuit node;

inversely controlling the conductivity of the first P-channel transistor with respect to the conductivity of the P-channel transistor in each of the CMOS inverter stages.

9. The compensation method of claim 8 including the step of coupling a series-connected second P-channel transistor and resistor between the source of constant supply voltage (VDD) and ground to form a control voltage at a junction between the second transistor and the resistor to control the conductivity of the first P-channel transistor.

10. The compensation method of claim 8 including the step of sizing the first P-channel transistor to provide a sufficient current flow to each of the inverter stages.

* * * * *